(12) United States Patent
Diamant et al.

(10) Patent No.: US 10,020,819 B1
(45) Date of Patent: Jul. 10, 2018

(54) SPECULATIVE DATA DECOMPRESSION

(71) Applicant: AMAZON TECHNOLOGIES, INC., Seattle, WA (US)

(72) Inventors: Ron Diamant, Albany, CA (US); Michael Baranchik, Natanya (IL); Ori Weber, Tel-Aviv (IL)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 15/718,669

(22) Filed: Sep. 28, 2017

(51) Int. Cl.
*H03M 7/40* (2006.01)
*H03M 7/30* (2006.01)

(52) U.S. Cl.
CPC ....... *H03M 7/6005* (2013.01); *H03M 7/3084* (2013.01); *H03M 7/4037* (2013.01); *H03M 7/6023* (2013.01)

(58) Field of Classification Search
CPC ............. H03M 7/6005; H03M 7/4037; H03M 7/3084; H03M 7/6023; H03M 7/30; H03M 7/40; H03M 7/00; H03M 5/00; H03M 7/4031
USPC ............................................... 341/67, 51, 50
See application file for complete search history.

(56) References Cited

U.S. PATENT DOCUMENTS

| | | | | |
|---|---|---|---|---|
| 5,485,526 A * | 1/1996 | Tobin | ...................... | G06T 9/005 341/106 |
| 5,703,793 A * | 12/1997 | Wise | ................... | G06F 12/0207 375/E7.093 |
| 5,920,353 A * | 7/1999 | Diaz | ...................... | H04N 19/42 375/240.15 |
| 5,945,933 A * | 8/1999 | Kalkstein | ............ | H03M 7/3086 341/106 |
| 6,043,765 A | 3/2000 | Twardowski | | |
| 6,121,903 A * | 9/2000 | Kalkstein | ............ | H03M 7/3086 341/106 |
| 6,657,565 B2 * | 12/2003 | Kampf | ................ | H03M 7/3088 341/51 |
| 7,492,763 B1 * | 2/2009 | Alexander, Jr. | ...... | H04L 12/4645 370/389 |
| 8,106,799 B1 * | 1/2012 | Yang | ................... | H03M 7/3086 341/106 |
| 2003/0156652 A1 * | 8/2003 | Wise | ..................... | G06F 9/3867 375/240.26 |
| 2008/0198918 A1 * | 8/2008 | Van Der Vleuten | ... | H04N 19/50 375/240 |
| 2009/0274217 A1 * | 11/2009 | Boyce | ...................... | G06T 3/40 375/240.16 |
| 2013/0322550 A1 * | 12/2013 | Symes | ................... | H04N 19/44 375/240.26 |

* cited by examiner

Primary Examiner — Jean B Jeanglaude
(74) Attorney, Agent, or Firm — Blank Rome LLP (57) ABSTRACT

A computing system includes a network interface, a processor, and a decompression circuit. In response to a compression request from the processor the decompression circuit compresses data to produce compressed data and transmits the compressed data through the network interface. In response to a decompression request from the processor for compressed data the decompression circuit retrieves the requested compressed data, speculatively detects codewords in each of a plurality of overlapping bit windows within the compressed data, selects valid codewords from some, but not all of the overlapping bit windows, decodes the selected valid codewords to generate decompressed data, and provides the decompressed data to the processor.

20 Claims, 7 Drawing Sheets

SPECULATIVE DATA DECOMPRESSION

BACKGROUND

The use of hardware systems to store and process data generally benefits from increased storage capacity and higher network bandwidths. Compression techniques are useful to reduce the amount of storage necessary to store a given dataset and/or to reduce the network bandwidth necessary to transfer data. Huffman coding is one such compression technique. Huffman coding is characterized by the use of variable length codewords with more frequently used symbols being encoded with fewer bits than less frequently used symbols. Huffman coding may be used by itself to compress plaintext data or may be combined with the Lempel-Ziv (LZ) coding technique or one of the variants of LZ coding (e.g., LZW, LZSS, LZMA, etc.). Because Huffman coding uses variable length codewords, the resulting compressed output data is not byte-aligned, which means the decoder does not know where a given codeword in a sequence of codeword begins and ends without having decoded the previous codeword in the sequence. As a result, the decoder serially decodes the compressed data by decoding the first codeword during which the length of the first codeword is determined. Once the first decoder is decoded and its length determined, the decoder then can determine where the second codeword begins. The second codeword is then decoded. After the second codeword is decoded and its length determined, the third codeword can be decoded, and so on.

BRIEF DESCRIPTION OF THE DRAWINGS

For a detailed description of various examples, reference will now be made to the accompanying drawings in which.

DETAILED DESCRIPTION

Rather than sequentially decoding each codeword of a series of Huffman codewords, the disclosed embodiments speculatively and concurrently (e.g., in parallel) detect codewords in each of a plurality of overlapping bit windows within the series of Huffman codewords to thereby increase the decoding speed. Valid Huffman codewords are selected from some, but not all of the overlapping bit windows, and the selected valid codewords are then decompressed. The decompressed Huffman codewords may comprise the underlying data to then be consumed (e.g., processed). However, some embodiments are directed to Deflate coding/decoding in which the underlying data is first compressed using LZ coding (e.g., any of its derivatives) and that compressed data is further compressed by a Huffman coding technique. Thus, the decompressed Huffman codewords noted above may comprise compressed LZ compressed data which are then "consumed" by further decompressing the LZ compressed data to obtain the underlying plaintext data.

Each of the plurality of bit windows begins on a different bit of the series of Huffman codewords, and each bit of the series of Huffman codewords is the initial bit of a different bit window. Not all bit windows will start a valid Huffman codeword. For example, if the first bit of a series of Huffman codewords starts at the beginning of a 10-bit codeword, the second bit in the series will be the second of 10 bits in the codeword and thus will not itself be the start of a valid Huffman codeword—the next valid Huffman codeword would start on the eleventh bit in this example. Thus, even if the decompression circuit of the disclosed embodiments detects Huffman codewords beginning at each bit of compressed data, some of the detected Huffman codewords from some of the bit windows will not be selected based on the length of those Huffman codewords that are determined to be valid.

Example embodiments pertain to the decompression of compressed data that has previously been compressed according to the Huffman compression process. In some examples, the data that is Huffman-compressed may comprise plaintext data. In other examples, the Deflate algorithm may be used which combines the LZ compression process with the Huffman compression process. Per the Deflate algorithm, the plaintext data is LZ-compressed and then the LZ-compressed data is further compressed according to the Huffman compression process.

Deflate compression has two modes: static and dynamic. In the static mode, the Huffman encoding tables, which map symbols to Huffman codewords, are constant. In the dynamic mode, the encoding tables are computed on a transaction basis and the encoded Huffman trees are stored as a header in the compressed file. The Deflate compression process uses a pair of Huffman trees for each of the static and dynamic modes. Each tree has multiple leaf nodes. The leaf nodes of one tree comprise literal or length values (see below) and the leaf nodes of the other tree comprise offset values. The disclosed embodiments are directed to decompressing Huffman-compressed data to recover the underlying plaintext data or, if the Deflate process has been used, the underlying LZ compressed data to be further decompressed to recover the input plaintext data.

The LZ compression process generally comprises detecting repeating sequences in the input plaintext data and replacing the repeated sequences with a length and offset tuple. The length value comprises the length of the repeating sequence and the offset comprises the number of bit positions to the previous instance of the repeating sequence. The output of an LZ compression process is a sequence of bits that comprise a combination of length, offset tuples as well as literals. A literal is a symbol within plaintext data that is not determined to be part of repeating sequences and thus is not replaced with a length, offset tuple. Huffman compression comprises replacing each symbol in the data to be compressed (be it plaintext data or LZ-compressed data comprising a combination of literals and length/offset tuples) with a variable length codeword. The number of bits (i.e., length) of each codeword depends on how frequently that symbol is present in the data set to be compressed. Those symbols that are present more frequently are compressed with shorter codewords than symbols that are present less frequently.

Figure 1:
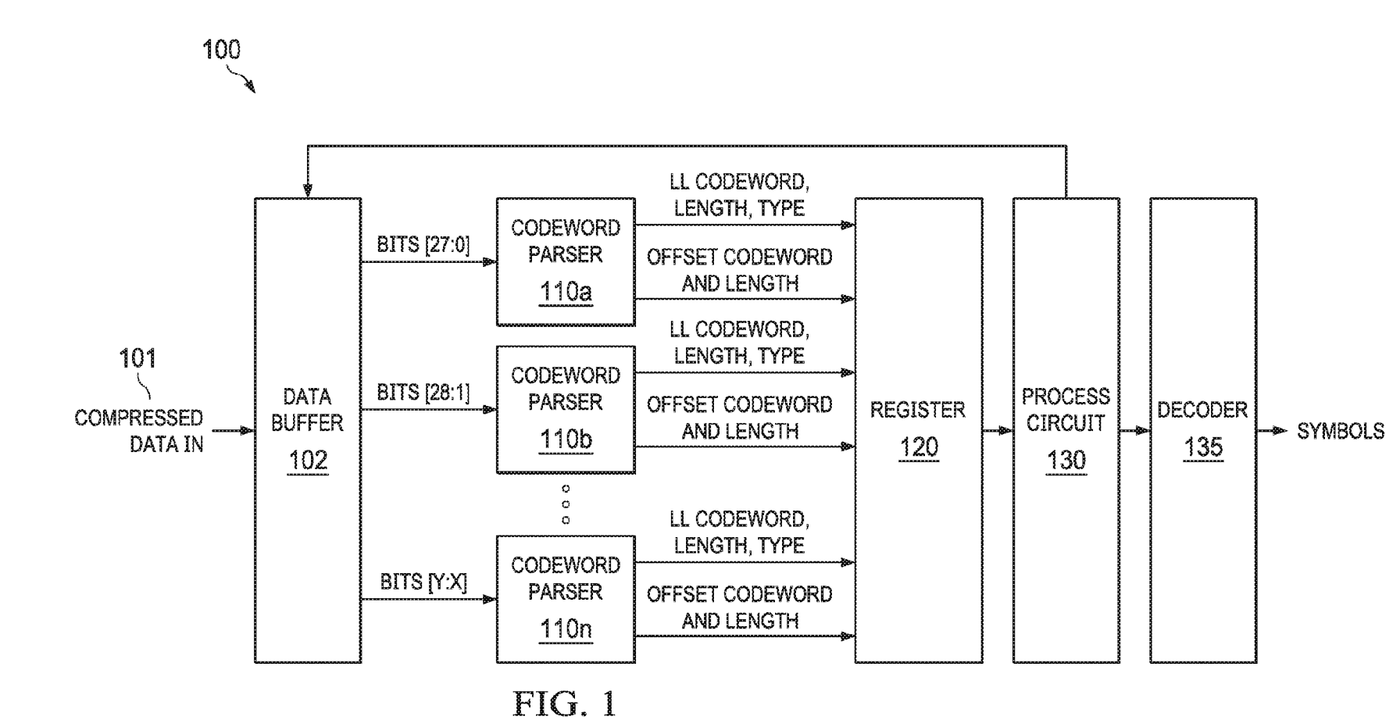
FIG. 1 shows a decompression circuit in accordance with various examples.

FIG. 1 shows an example of a decompression circuit 100 for decompressing Huffman-compressed data. In the example of FIG. 1, the decompression circuit 100 comprises a data buffer 102, a plurality of codeword parsers 110a, 110b, . . . 110n (collectively codeword parsers 110), a register 120, a process circuit 130, and a decoder 135. The input data 101 to the decompression circuit 100 is compressed data that includes a sequence of Huffman codewords. Some or all of the compressed input data is stored in data buffer 102. Each codeword parser 110 is configured to receive a plurality of contiguous bits of the compressed data within a bit window defined for the compressed data.

Figure 2:
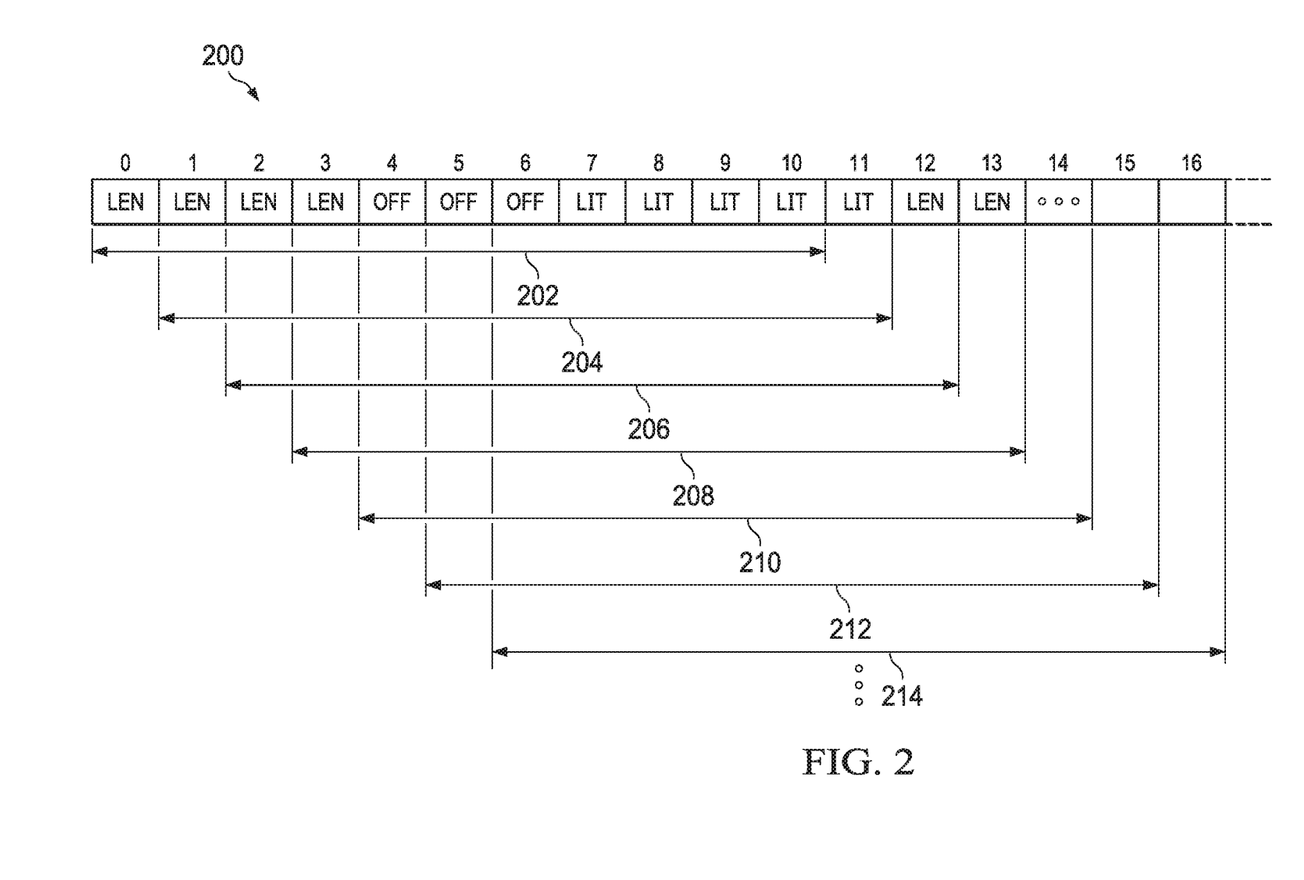
FIG. 2 illustrates the use of overlapping bit windows in the decompression circuit in accordance with various examples.

FIG. 2 shows an example of a sequence of bits 200 of Huffman-compressed data. In this example, bits [3:0] comprise a codeword that corresponds to a length value of a literal/length Huffman tree (indicated in FIG. 2 by the label "LEN"). Bits [6:4] comprise a codeword that corresponds to an offset value of an offset Huffman tree (indicated in FIG. 2 by the label "OFF"). Further, bits [11:7] comprise a codeword that corresponds to a literal value of the literal/length Huffman tree (indicated in FIG. 2 by the label "LIT"). A bit window is shown defined for each bit in the sequence 200. Bit window 202 corresponds to bit 0 (the starting bit of the bit window 202). Bit window 204 corresponds to bit 1. Bit window 206 corresponds to bit 2. Bit window 208 corresponds to bit 3. Bit window 210 corresponds to bit 4. Bit window 212 corresponds to bit 5 and bit window 214 corresponds to bit 6. The length of the bit windows may comprise the length of the maximum size of a codeword. In the example of FIG. 2, each bit window is 11 bits long, but can have a different length (e.g., 28 bits) in other examples.

Each bit window is defined by a starting bit index and an ending bit index. For example, the starting and ending indices for bit window 202 include bits 0 and 10, respectively. The starting bit of bit window 202 is the first bit of a valid length codeword, whose length is 4 bits. Thus, the next valid codeword starts at bit 4 which corresponds to the starting bit of bit window 210. Bit windows 204, 206 and 208 comprise sequences of bits that may match to leaves in the Huffman trees, but those codewords are not valid. For example, bit 1 cannot be the start of a valid codeword because bit 1 is the second bit of a 4-bit length codeword that began at bit 0.

Referring back to FIG. 1, each codeword parser 210 receives the bits of a corresponding bit window. For a 28-bit window implementation, bits [27:0] are provided to codeword parser 110a, while bits [28:1] are provided to codeword parser 110b, and so on. Thus, the codeword parsers 110 receive the bits of overlapping bit windows. Beginning with the starting bit, each codeword parser 110 determines whether to which leaf in the literal/length tree and in the offset tree its bits map. The output of each codeword parser 110 includes the codeword determined from the literal/length tree and the offset codeword determined from the offset tree, as well as the length of the literal/length codeword and its type (whether it is a literal codeword or a length codeword) and the length of the offset codeword. The codeword parsers 110 operate concurrently to process the bits within each bit window to thereby speculatively detect the presence of codewords beginning at each bit in the bit sequence to be decoded. The results from each codeword parser 110 are stored in register 120. As explained below, the process circuit 130 accesses the contents of the register 120 to determine which codeword parsers' output codewords are valid and which are not valid. Valid codewords from the process circuit 130 are then decoded by decoder 135 to generate the underlying symbols (which may comprise LZ-compressed data or plaintext data).

Figure 3A:
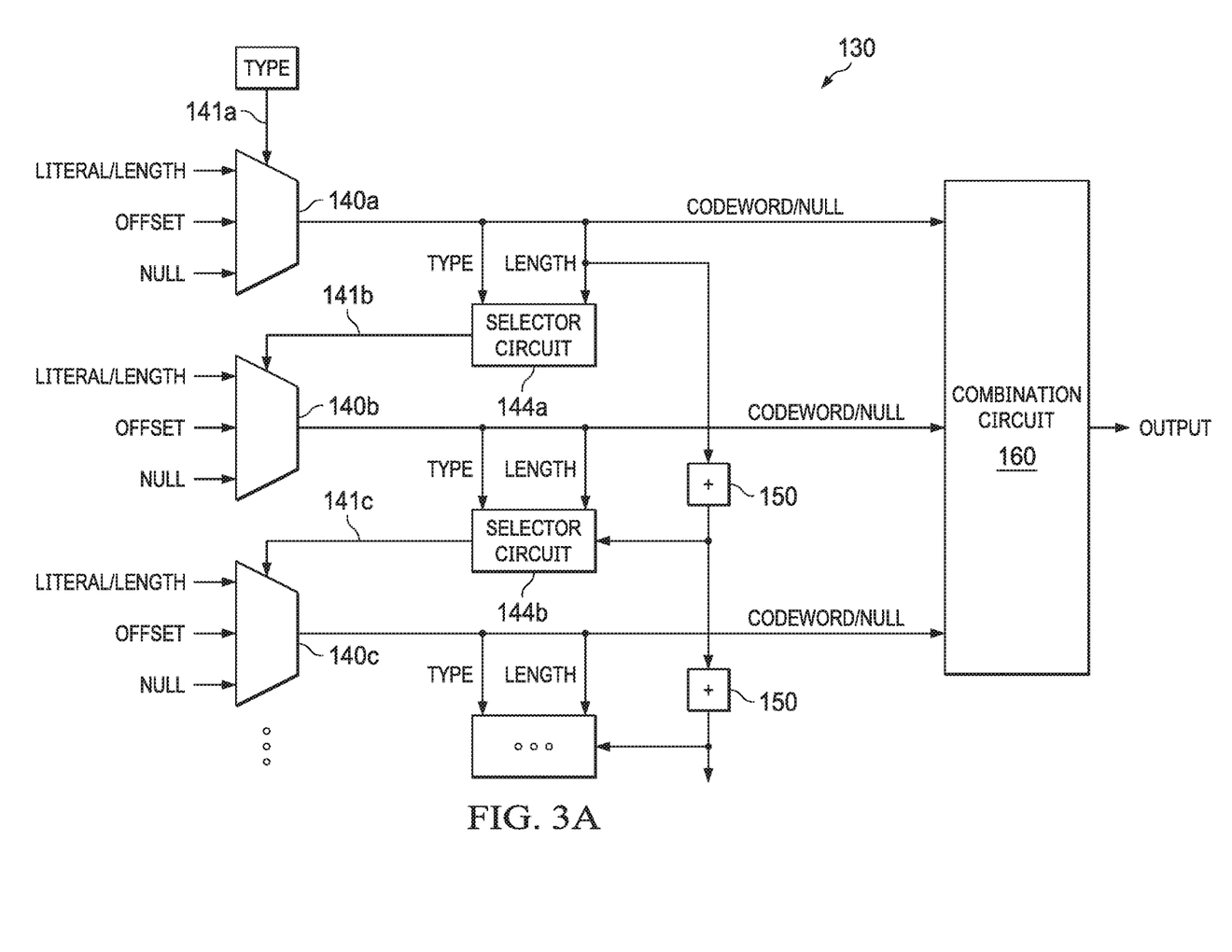
FIG. 3A shows a portion of the decompression circuit in accordance with various examples.

FIG. 3A shows an example of the selection circuit 130 in accordance with an illustrative embodiment. The process circuit 130 in this example includes a plurality of multiplexers 140a, 140b, 140c, etc. (collectively multiplexers 140), with one multiplexer 140 for each codeword parser 110. The process circuit 130 also includes selector circuits 144s, 144b (collectively selector circuits 144), adders 150, and a combination circuit 160. For each codeword parser, each multiplexer 140 includes as inputs the literal/length codeword detected by the corresponding parser, the offset codeword and a null value. In one example, the null value is 0. A separate control signal is provided to each multiplexer 140 to cause the multiplexer to output one of its inputs. Thus, the output of a given multiplexer 140 is the literal/length codeword, the offset codeword, or the null value.

The control signal 141a for the first multiplexer 140a is based on the type of codeword detected by codeword parser 110a beginning at the first bit [0]. That codeword is either a literal codeword or a length codeword. As an offset codeword can only follow a length codeword, there should be no offset codeword present beginning at bit [0]. Thus, the control signal 141a is preset to select the literal/length codeword input to the multiplexer 140a. The selected codeword is provided through the multiplexer 140a to the combination circuit 160. The type of the codeword (literal or length) is provided as well to the selector circuit 144a which generates the control signal 141b for the next multiplexer 140b. The length of the codeword output by multiplexer 140a also is provided to the selector circuit 144a and to adder 150.

The selector circuit 144a generates the control signal 141b for the next multiplexer 140b based on the type and aggregate length inputs. If the aggregate length input (i.e., the total length of all previous codewords as output by adder 150 associated with each codeword) comprises a value that is larger than the index of the first bit in the bit window corresponding to codeword parser 110b, then the selector circuit 144a generates the control signal 141b to select the null input for multiplexer 140b. For example, if the aggregate length value is 20 bits, which is larger than bit [1] (the first bit of the bit window for codeword parser 110b), then neither the literal/length codeword nor the offset codeword detected by codeword parser 110b can be a valid codeword, and thus the null value for multiplexer 140b is selected to be output by the multiplexer. If, however, the aggregate length value input to the selector circuit 144a matches the index of the first bit in the bit window corresponding to codeword parser 110b, then the control signal 141b is set to select the offset codeword input if the type input indicates that the codeword detected by the previous codeword parser (e.g., codeword parser 110a) is a length codeword. If the previously detected codeword is a literal or an offset codeword, then the selector circuit 144a generates the control signal 141b to cause the multiplexer to select the literal/length codeword input to the multiplexer. Of course, multiplexer 140b corresponds to the second bit window, which starts with bit [1] and, as such, the previously detected codeword cannot be an offset codeword. However, the function performed by the selector circuit 144a, 144b, etc. is the same, and in general, the previously detected codeword potentially could be an offset codeword.

The adder 150 adds the previously determined aggregate codeword length with the length of the currently detected codeword to compute an updated codeword aggregate length. The codeword aggregate length represents the total combined length of valid codewords detected within the bit stream being decompressed beginning with bit [0]. Inputs to each adder 150 include the aggregate length from the preceding codeword and the length of the current codeword, and the output of each adder is an updated aggregate length taking into account the length of the current codeword.

The combination circuit 160 receives the valid codewords selected by the multiplexers (or the selected null values), although not all multiplexers output a valid codeword as explained above. The combination circuit 160 concatenates the sequence of valid codewords. In one example, the combination circuit 160 starts each codeword at the beginning of a byte and packs the byte(s) of the codeword to thereby byte-align the codewords. The combination circuit 160 then outputs the byte-aligned codewords to, for example, the decoder 135 for generating a sequence of symbols that map to the various Huffman codewords output by the combination circuit 160.

Figure 3B:
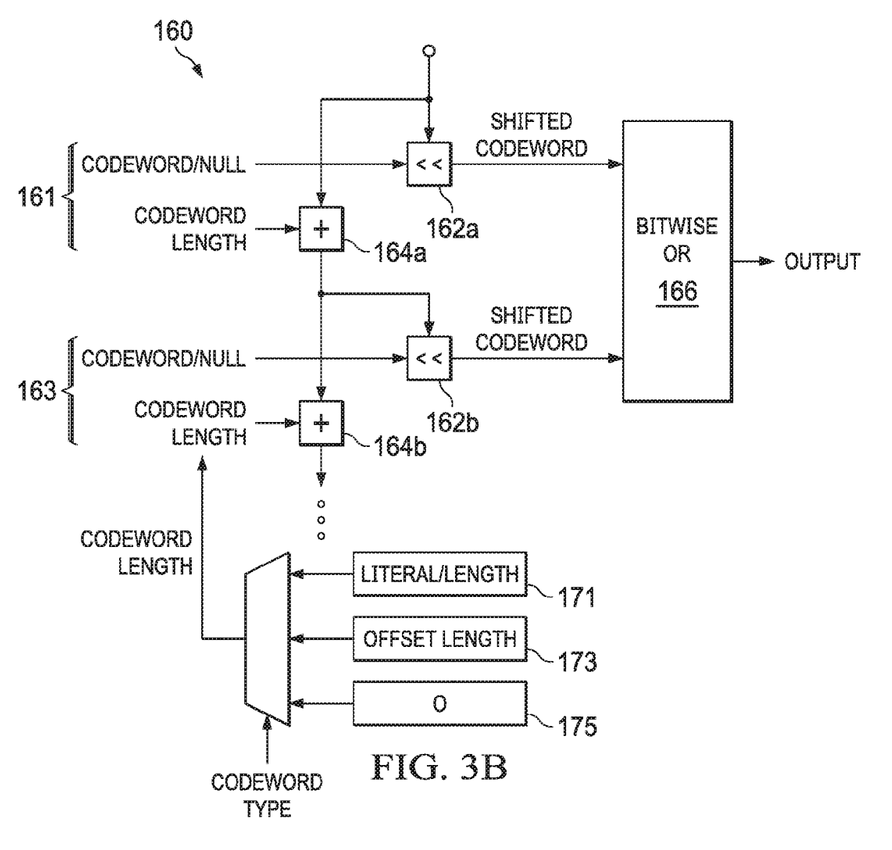
FIG. 3B shows an example of a combination circuit used in the decompression circuit of FIG. 3B.

FIG. 3B shows an example of an implementation of the combination circuit 160. In this example, the combination circuit 160 includes shift registers 162a, 162b (collectively shift registers 162), adders 164a, 164b (collectively adders 164), and a bitwise-OR circuit 166. One shift register 162 and one adder 164 is provided for each selected codeword/null value and shifts the codeword/null value by the length of the corresponding aggregate length value from the adder. The shift register 162a shifts the input codeword/null value at 161 (and as that value is the first codeword, it will be a codeword, not a null value) by 0 bits. The shift register 162b for the next codeword at 163 shifts the corresponding codeword/null value by the sum of 0 and the size of the decoded value corresponding to the Huffman codeword (e.g., the length of the LZ codeword to be further decoded). The length will be the length of an LZ (or other type of compression technique) literal value or an LZ length value, the size of an LZ offset value, or 0 (in the case of a null value) and thus depends on the type of the applicable codeword. The LZ size values may be stored in configuration registers 171 (literal/length value), 173 (offset value), and 175 (0 for the case of a null value). The length value from the configuration registers 171, 173, 175 is selected by way of a multiplexer in this example based on a control input that is, or is related to the type of codeword (literal/length, offset, null). The bit-shifted codeword/null values are then provided to the bitwise-OR circuit where they are bitwise-OR'd together to form the output data as noted above.

Figure 4:
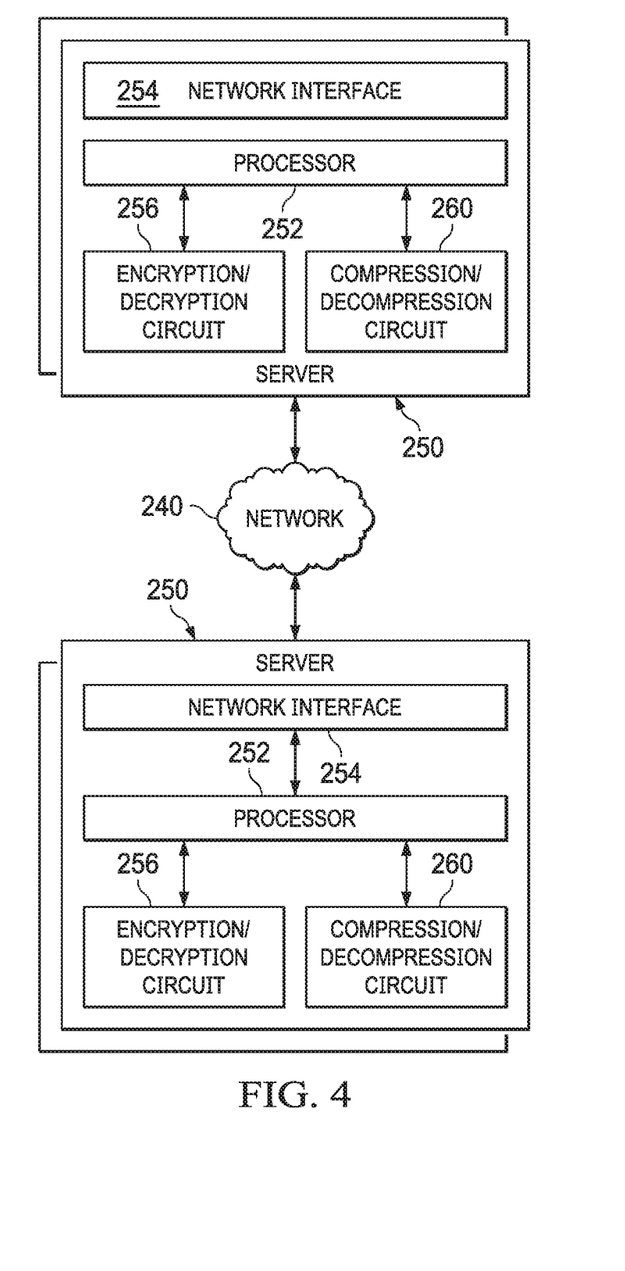
FIG. 4 shows an embodiment of the use of the decompression circuit in accordance with various examples.

FIG. 4 shows an example of multiple servers 250 coupled together via a network 240. The servers 250 may comprise servers within a data center such as in some embodiments for a cloud-based service provider network. In other embodiments, the servers 250 are owned and operated by a private organization (e.g., business) for its own internal use. Each server 250 comprises one or more processors 252, network interface 254, encryption/decryption circuit, and compression/decompression circuit 260. The processor 252 of one server may initiate the compression and encryption of data to be transmitted across the network 240 to another server, which then decrypts and decompresses the data. The encryption/decryption circuit 256 of each server 250 may comprise an accelerator integrated circuit (IC) that performs the encryption and decryption operations as requested by the processor 252. The compression/decompression circuit 260 of each server 250 also may comprise an accelerator IC that performs the compression and decompression operations as requested by the processor 252 and described herein. In some embodiments, the encryption/decryption circuit 256 and compression/decompression circuit 260 are separate IC's, but in other embodiments, the encryption/decryption circuit 256 and compression/decompression circuit 260 are embodied in the same IC. In some embodiments, the data to be transmitted from one server to another is first compressed and then encrypted before transmitting the compressed and encrypted data over the network. However, the data can be encrypted first and then compressed if desired. By compressing the data before transmission across the network 240, regardless of whether the data is also encrypted, more efficient use of the network's bandwidth is made.

Figure 5:
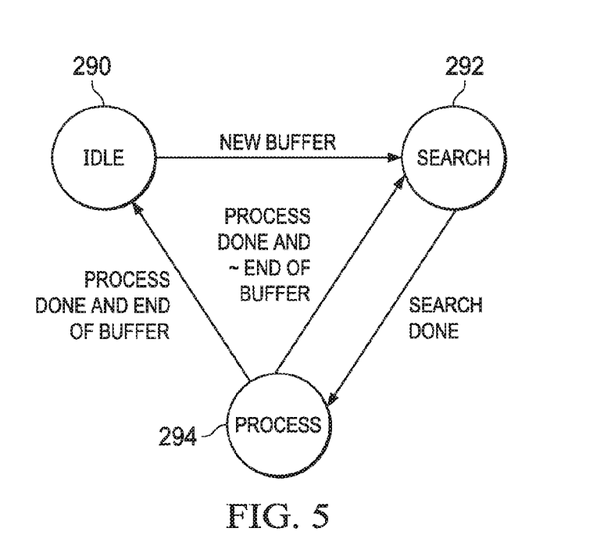
FIG. 5 illustrates a state diagram implemented by a state machine in accordance with various examples.

The disclosed embodiments may be implemented in an IC, a system-on-chip, a field programmable gate array, an application specific integrated circuit (ASIC), or other forms. Some embodiments are implemented as a finite state machine that iterates between "search" and "process" states. FIG. 5 shows an example of a state diagram that can be implemented by a finite state machine to perform the functionality described herein. The state diagram of the example of FIG. 5 includes an idle state 290, a search state 292, and a process state 294. The search state 292 corresponds to state in which the bit windows for codewords are analyzed for candidate codewords and the process state 294 is the state in which valid codewords are selected from some of the bit windows as explained above. When a buffer with new compressed data is available, the state of the state machine transitions from the idle state 290 to the search state 294. When the search state is completed (which may be 1 clock cycle or more than 1 clock cycle), the state transitions to the process state 294. The process state 294 may take multiple clock cycles and completes when all complete code words found in during the search state are processed, or when an end of buffer indicator is detected. If an end-of-buffer indicator is found, the state of the state machine transitions back to the idle sate 290. Otherwise, the state machine transitions back to the search state 292 to fetch more data to process.

Figure 6:
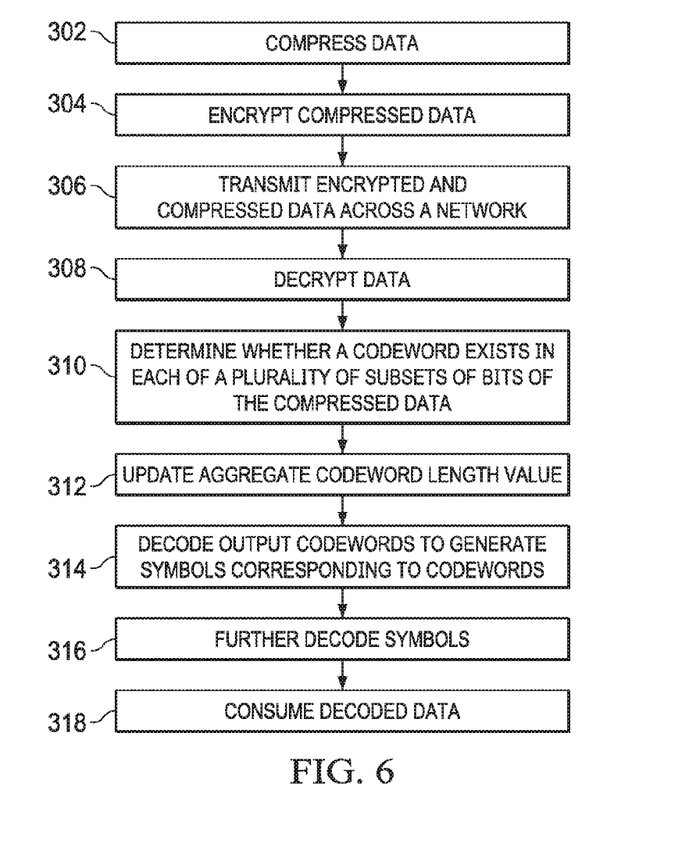
FIG. 6 shows a method in accordance with various examples.

FIG. 6 is a flow chart illustrating an example of a method embodiment. The operations can be performed in the order shown, or in a different order. Further, two or more of the operations may be performed concurrently rather than sequentially. At 302, the method comprises compressing data, for example by a server 250, to be transmitted across a network. The compression technique employed may include Huffman compression. Further, Deflate compression may be employed which includes one of the LZ compression processes followed by the Huffman compression process. Once compressed, the compressed data then is encrypted as illustrated at 304 in FIG. 6. Any suitable encryption technique may be employed for this purpose. At 306, the compressed and encrypted data is then transmitted across the network to a receiving server.

The receiving server decrypts the data at 308 to recover the compressed data. At 310, the method then includes determining whether a codeword exists in each of a plurality of subsets of bits (e.g., the bit windows explained above) of the compressed data. Each subset of bits is defined by a starting index value that differs from all other subsets of bits. At least some of the subsets of bits overlap with respect to each other. For example, one subset of bits includes bits [27:0]. The next subset of bits includes bits [28:1], while the next subset includes bits [29:2], and so on. This operation may include using the Huffman trees as explained above. Two or more subsets of bits can be processed in parallel to thereby increase the performance of the decompression process. Based on an aggregate codeword length value, the method may further include selectively outputting a codeword determined to exist in a given subset of bits or a 0-value.

At 312, the method of FIG. 6 further includes updating the aggregate codeword length value. At 314, the method includes decoding the output codewords determined to exist in at least some of the subsets of bits of the compressed data to generate symbols corresponding to the codewords. Operation 314 may be performed until an "end of buffer" marker is detected or when all of the valid codewords are found from the various bit windows from operations 310-312. Finally, the decoded data is consumed at 318. Consumption of the data may comprise processing the data, executing commands reflected in the data, further decompressing the data (e.g., performing LZ decompression), etc. Note that in some embodiments the compressed data is not encrypted and decrypted.

In some embodiments, detecting the occurrence of valid codewords from the various bit windows can be performed before all of the bit windows are analyzed for codewords. For example, 50 bit windows can be analyzed in parallel and followed by the selection of the valid codewords from those bit windows, followed by the analysis of additional bit windows and the ensuing selection of valid codewords from those bit windows, and so on.

Figure 7:
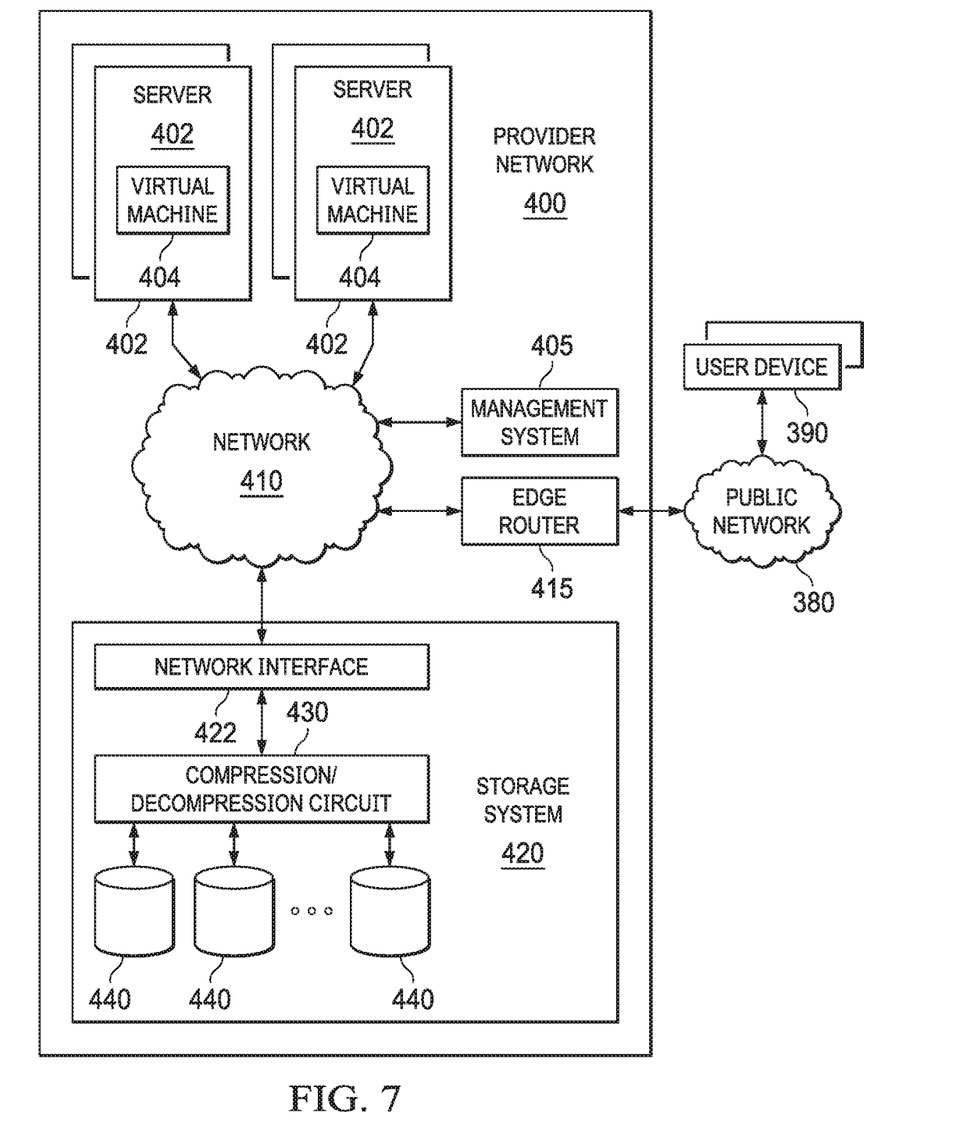
FIG. 7 shows another example of the use of the decompression circuit.

FIG. 7 illustrates another embodiment comprising a provider network 400 which includes multiple servers 402 coupled together by way of an internal network 410. Each server 402 can execute one or more virtual machines 404. Via external user devices 390 (e.g., personal computers, smart phones, tablet devices, etc.), users of the provider network 400 can access a management system 405 to perform any number of operations such as creating virtual machines, terminating virtual machines, halting execution of virtual machines, attaching a storage volume to a virtual machine, mapping a group of virtual machines to a load balancer, etc. The user devices access the provider network by way of public network 380 which comprises one or more of a wide area network, a local area network, the Internet, etc. The provider network 400 also includes an edge router 415 to provide connectivity to the user devices 390.

A storage system 420 is shown which comprises a network interface 422, a compression/decompression circuit 430, and a plurality of storage drives 440 (magnetic storage, solid state storage, etc.). The virtual machines 404 may include applications which may transmit data across the network 410 for storage in storage system 420 and also may read previously stored data from the storage system. The data may be written to the storage system 420 in uncompressed form, and the compression/decompression circuit 430 may compress the data in way such as that described above (e.g., Huffman compression, Deflate compression). Upon receipt of a read transaction by the storag Type equation here. e system, the compression/decompression circuit 430 may retrieve the compressed data from a storage device 440, decompress it as described above, and transmit plaintext data across the network 410 to the server that initiated the read transaction. By storing data in compressed form, more efficient use of storage is achieved.

The disclosed embodiments parallelize the analysis of overlapping bit windows for possible valid codewords thereby increasing the performance of the decompression process. If the average size of a codeword is X, the size of a buffer of compressed bits to process is W, and the clock frequency to operate the circuits described herein is F, then each search state in which the bit windows are analyzed in parallel will be followed by [W/X*N] process cycles in which valid codewords are selected from the possible bit window candidate codewords. The average decompression rate will then be $$\frac{W*F}{\frac{W}{X*N}+1}$$

bits per second (where N is the number of codewords processed in a given clock cycle). For W>>[X*N], the average decompression rate will be approximately F*X*N bits per second.

Certain terms are used throughout the following description and claims to refer to particular system components. As one skilled in the art will appreciate, different companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. An integrated circuit, comprising:
a data buffer to receive and store compressed data;
a plurality of codeword parsers coupled to the data buffer, wherein each codeword parser is configured to receive a plurality of contiguous bits of the compressed data, the plurality of contiguous bits received by each codeword parser overlaps the plurality of contiguous bits received by at least one other codeword parser, and wherein, in parallel, each codeword parser is configured to compare the corresponding contiguous bits to a literal/length tree and to an offset tree and to output a literal/length codeword upon detecting a match to a codeword of the literal/length tree and to output an offset codeword upon detecting a match to a codeword of the offset tree;
a selection circuit coupled to the codeword parsers and configured, for each codeword parser, to select the codeword parser's literal/length codeword, the codeword parser's offset codeword, or a null value, the selecting being responsive to a codeword type and codeword length for a preceding codeword in the compressed data; and
a decoder coupled to the selection circuit and configured to generate output data comprising a series of symbols selected in response to the selected literal/length codewords, offset codewords and null values.

2. The integrated circuit of claim 1, wherein the selection circuit is configured to determine an aggregate length of valid codewords and wherein the selection circuit is configured, for a given codeword parser, to select the codeword parser's null value responsive to a previous codeword parser outputting a valid literal codeword, a length codeword, or an offset codeword, and responsive to the aggregate length having a length value that is greater than a beginning bit index of the given codeword parser.

3. The integrated circuit of claim 1, wherein the selection circuit is configured to determine an aggregate length of valid codewords and wherein the selection circuit is configured, for a given codeword parser, to select the codeword parser's offset codeword responsive to selection of a length codeword from a previous codeword parser and an aggregate length having a length value that matches a beginning bit index of the given codeword parser.

4. The integrated circuit of claim 1, wherein the selection circuit is configured to determine an aggregate length of valid codewords and wherein the selection circuit is configured, for a given codeword parser, to select the codeword parser's literal or length codeword responsive to selection of a literal codeword or an offset codeword from a previous codeword parser and an aggregate length having a length value that matches a beginning bit index of the given codeword parser.

5. The system of claim 1, wherein the selection circuit comprises:
one multiplexer for each codeword parser;
a circuit for each multiplexer that receives a type value of a preceding valid codeword and a length value of the preceding valid codeword; and
an adder that adds the length value to an aggregate length value of previous valid codewords to generate a new aggregate length value.

6. The system of claim 1, wherein the codewords comprise Huffman codewords.

7. An integrated circuit, comprising:
a decompression circuit; and
wherein the decompression circuit is configured to:
retrieve compressed data, detect codewords in a first bit window that overlaps with a second bit window within the compressed data, select valid codewords from some, but not all of the overlapping bit windows, decode the selected valid codewords to generate decompressed data, and provide the decompressed data to the processor.

8. The integrated circuit of claim 7, wherein starting bits of the first and second bit window are contiguous bits in the compressed data.

9. The integrated circuit of claim 7, wherein the decompression circuit includes a codeword parser for the first bit window and another codeword parser for the second bit window, wherein each codeword parser determines whether the bits of the corresponding bit window match a codeword of a Huffman tree.

10. The integrated circuit of claim 7, wherein the decompression circuit includes a codeword parser for the first bit window and another codeword parser for the second bit window, wherein each codeword parser determines whether the bits of the corresponding bit window match a codeword of a literal/length tree or a codeword of an offset tree.

11. The integrated circuit of claim 10, wherein the decompression circuit includes a multiplexer for the first bit window and another multiplexer for the second bit window, wherein each multiplexer includes a first input to receive a codeword from the literal/length tree and a second input to receive a codeword from the offset tree.

12. The integrated circuit of claim 11, wherein each multiplexer also includes a third input to receive a zero value.

13. The integrated circuit of claim 12, wherein the decompression circuit determines the total length of valid codewords within at least some of the compressed data, and wherein each multiplexer for a given codeword parser includes a control input to select the first, second or third inputs based on a codeword type of a valid codeword determined from another codeword parser and the total length.

14. The integrated circuit of claim 13, wherein the control input for a given multiplexer is set to select the zero value responsive to the total length being a value that exceeds an index of the first bit in the bit window of the codeword parser corresponding to the given multiplexer.

15. The integrated circuit of claim 7, wherein the integrated circuit is a system-on-chip (SoC).

16. The integrated circuit of claim 7, wherein the decompression circuit includes:
a first shift register and a first adder for use in the first bit window to shift a codeword from the first bit window;
a second shift register and a second adder for use in the second bit window to shift a codeword from the second bit window; and
a bitwise operator circuit to bit-wise OR the shifted codewords from the first and second bit windows.

17. A method, comprising:
receiving compressed data;
determining whether a codeword exists in each of a plurality of subsets of bits of the compressed data, each subset of bits is defined by a starting index value that differs from all other subsets of bits and wherein at least some of the subsets of bits overlap with respect to each other;
based on an aggregate codeword length value, selectively outputting a codeword found in a given subset of bits or a zero value;
updating the aggregate codeword length value;
decoding output codeword found in at least some of the subsets of bits of the compressed data to generate symbols corresponding to the codewords; and
consuming decoded data.

18. The method of claim 17, wherein selectively outputting a codeword determined to exist in a given subset of bits or a zero value comprises selectively outputting a codeword determined to exist in the given subset of bits based on the aggregate codeword length matching a starting bit index of the subset of bits.

19. The method of claim 17, wherein selectively outputting a codeword determined to exist in a given subset of bits or a zero value comprises selectively outputting a zero value based on the aggregate codeword length not matching a starting bit index of the subset of bits.

20. The method of claim 17, wherein determining whether a codeword exists in each of the plurality of subsets of bits of the compressed data comprises concurrently determining whether a codeword exists in each of the plurality of subsets of bits of the compressed data.

* * * * *

UNITED STATES PATENT AND TRADEMARK OFFICE
CERTIFICATE OF CORRECTION

PATENT NO. : 10,020,819 B1
APPLICATION NO. : 15/718669
DATED : July 10, 2018
INVENTOR(S) : Ron Diamant et al.

Page 1 of 1

It is certified that error appears in the above-identified patent and that said Letters Patent is hereby corrected as shown below:

In the Specification

Column 7, Lines 53-54 should read -- Upon receipt of a read transaction by the storage system, --

Signed and Sealed this
Ninth Day of April, 2019

Andrei Iancu
*Director of the United States Patent and Trademark Office*